United States Patent [19]

Cantarelli et al.

[11] Patent Number: 4,719,184

[45] Date of Patent: Jan. 12, 1988

[54] PROCESS FOR THE FABRICATION OF INTEGRATED STRUCTURES INCLUDING NONVOLATILE MEMORY CELLS WITH LAYERS OF SELF-ALIGNED SILICON AND ASSOCIATED TRANSISTORS

[75] Inventors: Daniele Cantarelli, Monza; Giuseppe Crisenza, Trezzo Sull'Adda; Pierangelo Pansana, Muggio', all of Italy

[73] Assignee: SGS Microelettronica S.p.A., Catania, Italy

[21] Appl. No.: 22,482

[22] Filed: Mar. 6, 1987

Related U.S. Application Data

[63] Continuation of Ser. No. 784,323, Oct. 4, 1985, abandoned.

[30] Foreign Application Priority Data

Nov. 26, 1984 [IT] Italy ................................ 23737 A/84

[51] Int. Cl.[4] ............................................ H01L 21/26
[52] U.S. Cl. ...................................... 437/24; 437/26; 437/37; 437/46; 437/52; 437/61; 357/23.5
[58] Field of Search ...................... 29/571, 576 B, 578, 29/591; 427/38, 85, 86, 93; 357/23.5, 41, 91; 148/1.5; 250/492.2

[56] References Cited

U.S. PATENT DOCUMENTS 4,373,249 2/1983 Kosa ................................. 29/576 B
4,495,693 1/1985 Iwahashi ........................... 29/576 B

*Primary Examiner*—Olik Chaudhuri
*Attorney, Agent, or Firm*—Cushman, Darby & Cushman

[57] ABSTRACT

After growth of gate oxide, deposit and separation of a first polycrystalline silicon layer, growth of dielectric oxide and removal thereof from the transistor area, and deposit of a second polycrystalline layer, a single mask makes possible first etching of the second silicon layer and of the dielectric oxide and then of the first silicon layer of the gate oxide at the sides of the cell and transistor areas.

2 Claims, 9 Drawing Figures

4,719,184

PROCESS FOR THE FABRICATION OF INTEGRATED STRUCTURES INCLUDING NONVOLATILE MEMORY CELLS WITH LAYERS OF SELF-ALIGNED SILICON AND ASSOCIATED TRANSISTORS

This is a continuation of application Ser. No. 784,323 filed Oct. 4, 1985, now abandoned.

BACKGROUND OF THE INVENTION

The present invention relates to a process for the fabrication of integrated structures including nonvolatile memory cells with self-aligned silicon layers and associated transistors.

Nonvolatile memory cells, both EPROM and $E^2$—PROM, are known which include a first and a second layer of polycrystalline silicon superimposed on a monocrystalline silicon substrate having appropriately doped active areas. The first layer of silicon, which is closer to the substrate, constitutes the floating gate of the memory cell while the second layer, which is further from the substrate, constitutes the control gate of said cell. Silicon oxide with dielectric functions is interposed between the two aforesaid layers while gate oxide is interposed between the first polycrystalline silicon layer and the monocrystalline silicon substrate. The two polycrystalline silicon layers may if desired be aligned together, that is, as commonly termed, self-aligned.

Also known is the fabrication technique which calls for formation of the integrated structures with several memory cells side by side with self-aligned layers and associated transistors.

According to said technique as it is presently performed self-alignment of the two polycrystalline silicon layers is secured by subsequent use of two different masks, the first for etching of the second layer and the second for subsequent etching of the first layer. The use of two masks results in cost problems but is also important during etching of the first layer to avoid an undesired digging effect in the doped areas and the resulting damage thereto.

It should also be considered that the present fabrication technique forms a transistor with polycrystalline silicon layer separated from the monocrystalline silicon substrate by the same oxide which performs dielectric functions between the two superimposed layers of memory cells. This involves the employment of an interlayer oxide having characteristics better than necessary but which are indispensable for the transistor, which requires an oxide of good quality.

The object of the present invention is therefore to achieve a fabrication process for nonvolatile memory cells with self-aligned silicon layers and associated transistors which will save one mask and at the same time secure transistors with oxide different from the oxide interposed between the two layers of polycrystalline silicon of the memory cells.

SUMMARY OF THE INVENTION

In accordance with the invention said object is achieved by a fabrication process which includes in a known manner:
(a) formation of active areas on a monocrystalline silicon substate by the Planox process,
(b) growth of a gate oxide layer on the entire substrate structure,
(c) deposit of a first polycrystalline silicon layer and doping thereof, characterized in that it also includes:
(d) masking of the first polycrystalline silicon layer and removal of same at the sides of the zone which is to constitute the memory cell and transistor areas,
(e) growth of a dielectric oxide layer,
(f) removal of said dielectric oxide from the transistor area,
(g) deposit of a second polycrystalline silicon layer,
(h) masking and etching of the second polycrystalline silicon layer and of the underlying dielectric oxide at the sides of the cell and transistor areas,
(i) subsequent etching with identical masking of the first polycrystalline silicon layer and of the underlying gate oxide at the sides of the cell and transistor areas until drain and source areas are uncovered.

In other words, the process according to the invention calls for the employment of a single mask for subsequent etching of the second and of the first polycrystalline silicon layer, that is it saves one mask as compared with the conventional process. This is due to the fact that the etching of the second polycrystallilne silicon layer leaves the gate oxide to protect the active areas.

In addition the transistor area is formed of a polycrystalline silicon layer superimposed on gate oxide instead of on oxide such as that interposed between the two polycrystalline silicon layers. This makes it possible to select the transistor oxide of a different type and better suited than the one between the two aforesaid layers.

BRIEF DESCRIPTION OF THE DRAWINGS

The features of the present invention will be better understood by referring to the annexed drawings wherein.

DETAILED DESCRIPTION OF THE DRAWINGS

Figure 1:
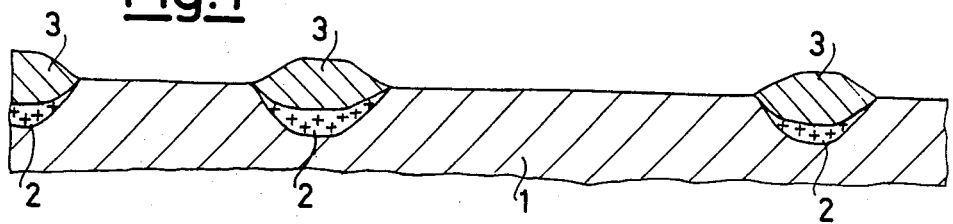
FIGS. 1-9 show the various steps of the process according to the invention.

The process illustrated in the drawings calls first of all for the formation on a monocrystalline silicon substrate 1 by means of the usual Planox process of insulation areas 2 having positive doping and protected by field oxide 3 (FIG. 1).

Figure 2:
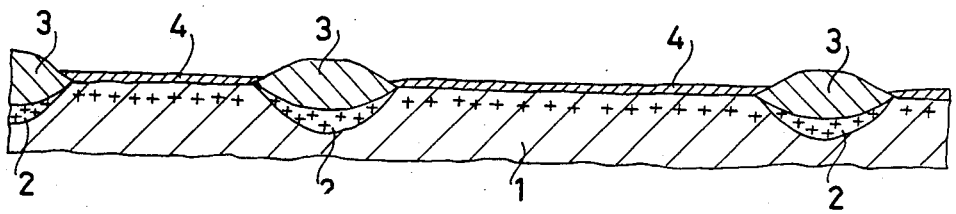

On the entire structure is grown gate oxide 4 (FIG. 2), whose thickness may be between 50 and 100 Å for $E^2PROM$ cells or from 150 to 400 Å for EPROM cells, and the areas which are to constitute the transistors and memory cells are doped by "+" type implantation and related masks.

Figure 3:
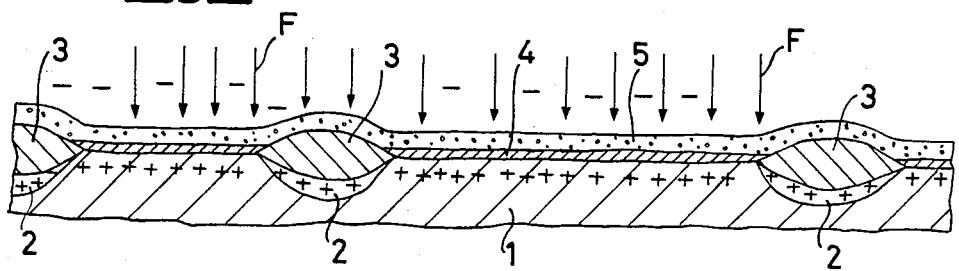

Subsequently a first polycrystalline silicon layer 5 (FIG. 3) which is to form the floating gates of the memory cell is deposited. The thickness of said layer may vary from 1500 to 3000 Å. Said layer is doped by implantation of P or As ions or with $POCl_3$. The doping operation is indicated in FIG. 3 by the arrow F accompanied by "−" signs.

Figure 4:
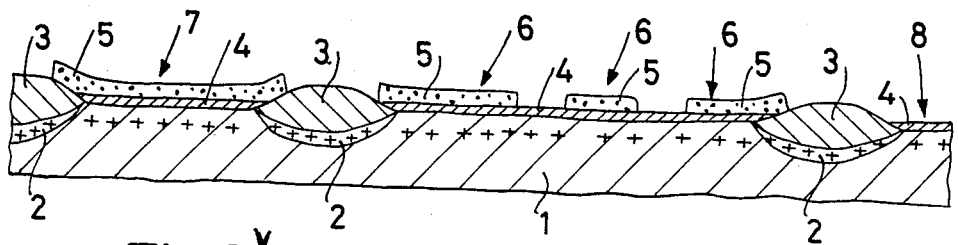

By appropriate masking said first polycrystalline silicon layer 5 is removed at the sides of the future memory cell area 6 and transistor area 7 as shown in FIG. 4. Removal is also extended to the deep contact areas 8.

Figure 5:
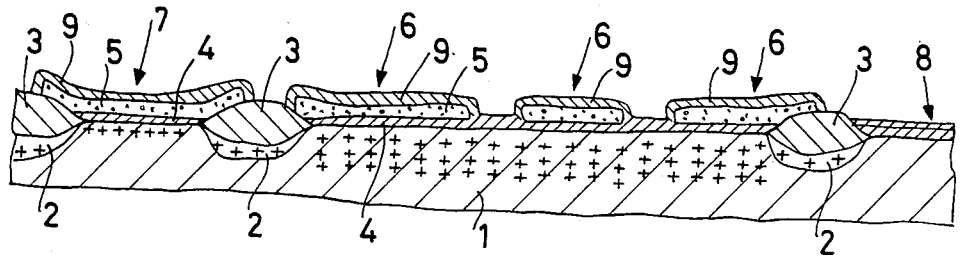

On the entire structure is then grown an oxide layer 9 which is to act as a dielectric between the two gates of the memory cell (FIG. 5). Thickness may vary between 200 and 600 Å. Instead of growth or in addition to it another dielectric layer may be deposited.

Figure 6:
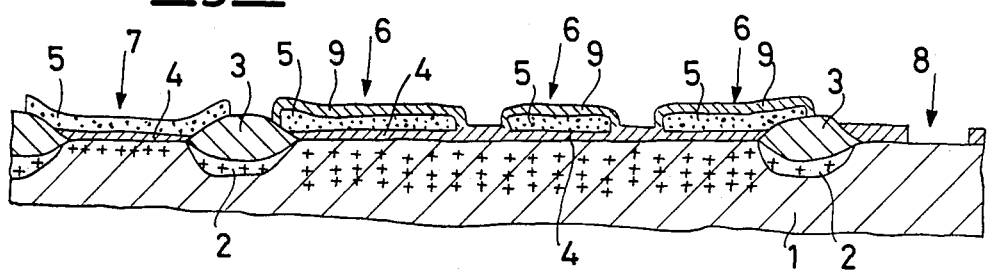

With appropriate masking the dielectric oxide 9 is removed from the transistor areas and the gate oxide 4 is also removed from the deep contact areas 8 (FIG. 6). After this operation, which is performed using the same mask employed for the formation of the deep contact areas in the conventional process, the dielectric oxide 9 exists only in the cell areas 6 over the floating gates.

Figure 7:
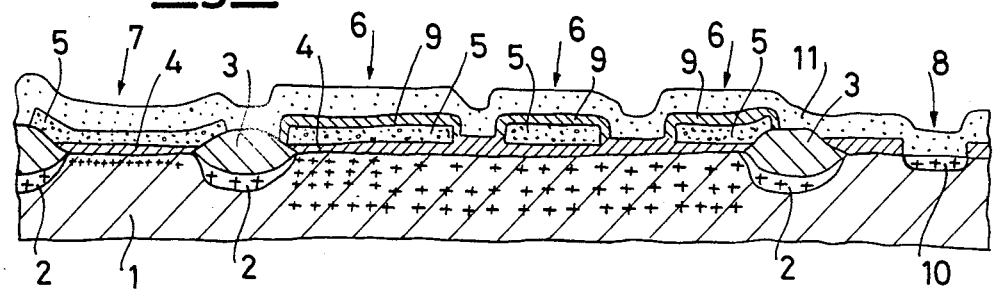

On the entire area is then deposited a second polycrystalline silicon layer 11 (FIG. 7) which is to function as the control gate of the memory cells 6 and the associated transistors 7. This silicon layer, whose thickness may vary from 300 to 5000 Å, is subjected to "−" doping and in this manner achieves direct contact with the monocrystalline silicon in the areas 10 of deep contacts 8 and with the first silicon layer 5 of the transistor 7 while a layer of dielectric oxide 9 remains interposed between the two layers of silicon 11 and 5 in he memory cells 6.

Figure 8:
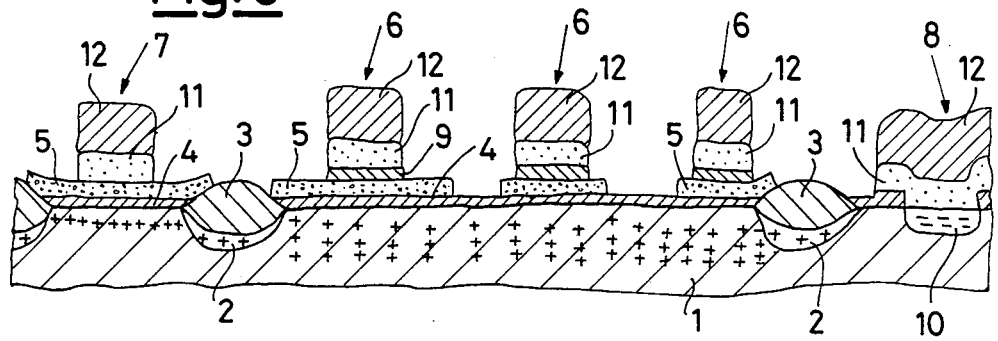

Finally a protective mask 12 for the cell-, transistor- and deep contact areas is applied and the second layer of silicon 11 is etched until the dielectric oxide 9 interposed between the two silicon layers 11 and 5 is bared. Etching is continued on the dielectric oxide 9 until the first silicon layer 5 is reached. The structure is at this point as shown in FIG. 8.

Figure 9:
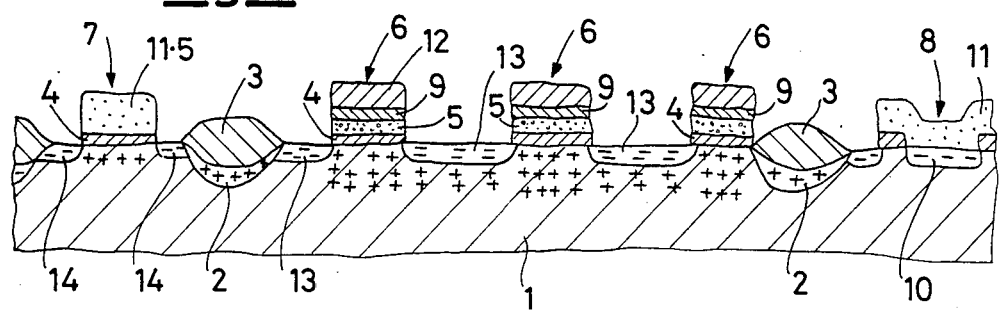

Further etching then removes the first layer of silicon 5 at the sides of the masked zones of the cell and transistor areas and the gate oxide 4 at the sides of the aforesaid zone is removed in such a manner as to uncover the areas 13 and 14 which are to become after negative doping source and drain areas of the memory cells 6 and transistors 7. By way of example the final structure with three memory cells 6 having layers 11 and 5 self-aligned, one transistor 7 and one deep contact 8, is illustrated in FIG. 9.

We claim:

1. Process for the fabrication of integrated structures including nonvolatile memory cells with self-aligned silicon layers and associated transistors comprising sequentially:
   (a) forming insulation areas on a monocrystalline silicon substrate, doping the insulation areas with a positive conductivity type modifier and growing field oxide on the area so doped,
   (b) doping the remaining portions of the monocrystalline silicon substrate with a positive type conductivity modifier and growing a gate oxide layer on the entire substrate structure,
   (c) depositing a first polycrystalline silicon layer and doping said layer with a negative conductivity type modifier, characterized in that the process also comprises:
   (d) masking of the first polycrystalline silicon layer and removal thereof at the sides of the zones which will constitute the memory cell and transistor areas,
   (e) growth of a dielectric oxide layer,
   (f) removal of said dielectric oxide from the transistor areas,
   (g) deposit of a second polycrystalline silicon layer,
   (h) masking and etching of the second polycrystalline silicon layer and of the underlying dielectric oxide at the sides of the cell and transistor areas, and
   (i) subsequent etching with identical masking of the first polycrystalline silicon layer and of the underlying gate oxide at the sides of the cell and transistor areas until drain and source areas are uncovered.

2. Process in accordance with claim 1 characterized in that it comprises the formation of deep contact areas, said formation being secured by removal of the dielectric oxide from the zones which are to constitute said areas during removal of said dielectric oxide from the transistor areas, deposit of said second polycrystallilne silicon layer, and definition of the contact areas by said masking of the second polycrystalline silicon layer.

* * * * *